United States Patent [19]

Chen

[11] 4,024,517

[45] May 17, 1977

[54] CONTINUOUS DATA STREAM FIFO MAGNETIC BUBBLE DOMAIN SHIFT REGISTER

[75] Inventor: Thomas T. Chen, Yorba Linda, Calif.

[73] Assignee: Rockwell International Corporation, El Segundo, Calif.

[22] Filed: Oct. 31, 1975

[21] Appl. No.: 627,737

[52] U.S. Cl. .......................................... 340/174 TF
[51] Int. Cl.² .......................................... G11C 11/02
[58] Field of Search ............... 340/174 CL, 174 TF

[56] References Cited
UNITED STATES PATENTS

| | | | |
|---|---|---|---|
| 3,890,605 | 6/1975 | Sionczewski | 340/174 CL |
| 3,919,701 | 11/1975 | Chang | 340/174 CL |

*Primary Examiner*—Thomas B. Habecker

*Attorney, Agent, or Firm*—H. Fredrick Hamann; G. Donald Weber, Jr.

[57] ABSTRACT

There is described a simple first-in, first out (FIFO) magnetic bubble domain shift register which has continuous data storage capability. In a preferred embodiment, two parallel detector branches are associated with a main storage loop. The bubbles in the storage loop are replicated toward each detector branch by passive replicators in the storage loop. Annihilators associated with each of the replicators and each of the detectors are arranged an appropriate distance from the replicators so that selective energization of the annihilators permits certain bits to propagate to one detector and other bits to propagate to the other detector. Connection of the detectors in an appropriate bridge circuit permits full data rate reclamation.

13 Claims, 1 Drawing Figure

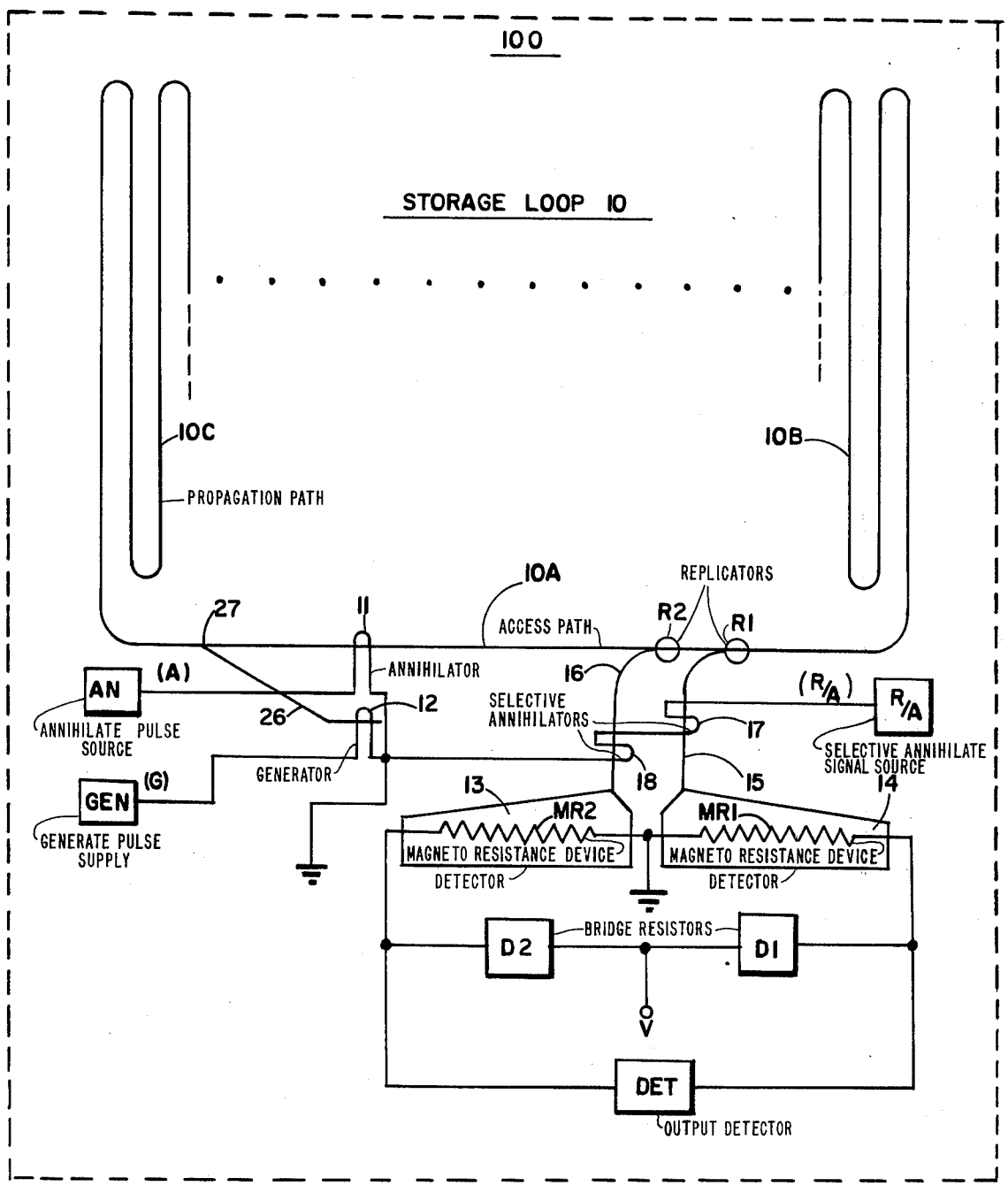

CONTINUOUS DATA STREAM FIFO MAGNETIC BUBBLE DOMAIN SHIFT REGISTER

The invention described herein was made in the performance of work under NASA Contract No. NAS 1-12435 and is subject to the provision of Section 305 of the National Aeronautics and Space Act of 1958 (72 Stat. 435; 42 U.S.C. 2457).

BACKGROUND OF THE INVENTION

1. Field of the Invention

This invention relates to magnetic bubble domain devices. In particular, a FIFO magnetic bubble domain shift register for use in a memory and having continuous data storage capabilities.

2. Description of Prior Art

Many magnetic bubble domain devices are known in the art. Such magnetic bubble domain devices are arranged to provide various systems and system applications. Most appropriate for magnetic bubble domain systems appears to be memory applications. Typically, memory applications utilize shift registers and the like.

In memory shift register designs, there have been proposed many simple loop first-in, first-out (FIFO) bubble domain memory shift registers and the like. These shift register designs usually include three basic control functions, i.e. generation, annihilation and detection of the bubbles. However, in the existing circuits, various problems are encountered. For example, when the detection circuit is inserted into the storage loop, there is produced a finite separation of time and distance between the detector and the annihilator positions. Of course, the generator can be located in a separate branch and, thus, positioned independently and, therefore, aligned with respect to one or more of the other control functions. If the generator is aligned with the annihilator, a gap of time and space in the memory loop is produced. This requires a chip align mode of operation in a multiple chip system. If the generator is aligned with the detector, there is a delay between the generator and annihilator which requires additional electronics to keep track of the status and operating mode of the chip.

On the other hand, if the detector is merely removed from the propagation track or storage loop wherein the position thereof can be aligned with the generator and annihilator simultaneously, obvious advantages can be obtained. However, this arrangement typically requires a replicator to replicate any incoming bubble so that a bubble may be supplied to the detector and, as well, propagated through the storage loop track to provide nondestructive readout. Existing active replicators can be used for this purpose but, generally, require bipolar control pulses wherein complicated driver circuitry is required. In the situation where a passive replicator is utilized, the requirement for control currents is obviated but bubbles are continuously replicated wherein the detector is prevented from operating in an alternate bit read mode. This latter shortcoming places restrictions on the operation and design of the detector. Moreover, the detector operation is then a serious limitation on the operation of the bubble domain system due to the inherent operating characteristics of the detector and associated materials.

SUMMARY OF THE INVENTION

The invention relates to a magnetic bubble domain first-in, first-out (FIFO) shift register which utilizes a continuous data stream. A pair of parallel detectors are coupled to a continuous storage loop by appropriate replicator devices. A pair of annihilators are connected in series. Each of the annihilators is associated with a coupling path between a replicator and a detector. The annihilators are arranged so that the distance between one of the replicators and each of the annihilators differs by a prescribed number of bits. When the annihilators are selectively energized, bubbles (or bits) from the storage loop will be propagated to one detector or the other in accordance with a predetermined arrangement. For example, it can be arranged so that the odd numbered bits are replicated and propagated toward one detector while the even numbered bits are replicated and propagated to the other detector. When the two detectors are placed in the same bridge circuit, a full data rate can be reclaimed.

BRIEF DESCRIPTION OF THE DRAWINGS

In the single FIGURE, there is shown a schematic representation of a memory chip organization using passive replicators, annihilators and a guardrail detector.

DESCRIPTION OF A PREFERRED EMBODIMENT

Referring now to the sole FIGURE, there is shown a typical bubble domain system. In particular, there is shown a memory chip organization. A suitable storage loop 10 is defined on a layer 100 of suitable magnetic material which supports magnetic bubble domains. The type of material, whether crystalline or amorphous, is not critical to the invention and may be of any of the well known types of materials such as, but not limited to, garnet films. Loop 10 may comprise any type of propagation path, such as chevrons, Y-bars, T-bars or the like. Storage loop 10 includes end portions 10B and 10C as well as intermediate portions which are omitted for clarity. Track 10A of loop 10 is the access path or propagation path at which control functions are performed. For example, annihilator 11 is represented as a conductor loop which encompasses a portion of the propagation path of storage loop 10. Such an annihilator device is well known in the art. Annihilator 11 is connected to control element AN and to a common reference point such as ground. The control element represents a source of pulses and produces the annihilate (A) signals. These signals are applied to the annihilator 11 to selectively annihilate individual bubbles or to clear all of the bubbles in propagation path 10.

Likewise, generator 12 is associated with substantially the same location on access path 10A of storage loop 10. Generator 12 is suggested as a conductor loop generator as is known in the art. The conductor loop of generator 12 is connected between control element GEN and the common point. Element GEN selectively supplies pulses (G) to generate bubbles in propagation path 26 for insertion into access path 10A of storage loop 10. It must be noted that the length of the propagation path portions between generator 12 and annihilator 11 to the common point 27 in the storage loop is the same. Through the operation of control functions AN or GEN, bubbles may be annihilated or generated, respectively, in storage loop 10.

Also associated with storage loop 10, for example, at access path 10A, are replicators R1 and R2. These replicators are passive replicators which are formed in typical fashion of a known design. Active replicators may be used but appropriate control signals are required therefor. The replicators are inserted at different locations of access path 10A. However, replicators R1 and R2 are generally in fairly close proximity to one another. Detectors 13 and 14 are connected to replicators R1 and R2 by means of coupling paths 15 and 16, respectively. The coupling paths typically take the form of a suitable propagation path comprising elements of any suitable design such as chevrons or the like. Detectors 13 and 14 are schematically shown but may comprise known chevron detectors which expand the bubbles wherein detection thereof is made more reliable.

Detectors 13 and 14 include suitable sensing elements MR1 and MR2, respectively. These sensing elements which may be magnetoresistance devices are connected as part of an output bridge element including bridge resistors D1 and D2, respectively. The bridge element is connected to an output detector DET in suitable fashion. Moreover, it should be noted that the propagation path distance from replicator R1 to detector 14 (at MR1) is the same as the distance from replicator R1 to detector 13 (at MR2). Thus, coupling paths 15 and 16 are arranged to provide the proper operational path distance in the circuit. Also, to establish the component alignment discussed supra, the propagation path (operational) distance between replicator R1 and generator 12 (or annihilator 11) is the same as the length of coupling path 15 (i.e. from replicator R1 to detector 14).

A selective annihilator is associated with each of the coupling paths. For example, selective annihilators 17 and 18 are illustrated as loops which encompass at least portions of the coupling paths 15 and 16, respectively. The selective annihilators 17 and 18 are connected in series with each other. Function control element R/A is connected to supply signals R/A to the selective annihilator switches.

In the embodiment shown in the figure, the conductor loops of selective annihilators 17 and 18 are connected in series between the function control element R/A and the common reference point. Likewise, the conductor loops of annihilator 11 and generator 12 are connected between the respective control elements and the common reference point. These connections permit all of the signals supplied to be of one polarity. Other specific arrangements of the control elements can be achieved if other signal parameters are utilized.

In effecting the operation of the system shown and described, many standard or typical operations are performed. For example, bubbles are generated at generator 12 and applied to storage loop 10 in a known manner. The bubbles are produced as a result of the pulse timing and polarity relative to the applied rotational field $H_R$. Individual bubbles (or all bubbles) may be annihilated by signal A at annihilator 11 in response to signal (A). Thus, the information contents (bubbles) in storage loop 10 is controlled. In reading out, however, it is important that certain conditions be included in the circuit design. In particular, it should be understood that replicators R1 and R2 are passive, non-destructive replicators. Thus, non-destructive readout is achieved wherein bubbles propagating along access path 10A of storage loop 10 continue to propagate therealong and, as well, are passively replicated by replicator switches R1 and R2, respectively. That is, no transfer or replicate signal form a separate control function is required. The replicated bubbles are applied to the appropriate detectors by propagation along coupling paths 15 and 16, respectively. It is important to note that the distance between replicator switch R1 and selective annihilator 18 is different from the distance between replicator R1 and selective annihilator 17 by a predetermined number of bits (or bit positions). In particular, if detectors 13 and 14 operate on alternate bubbles or bits, the predetermined difference in distance noted above should be the equivalent of an odd number of bits.

Thus, when selective annihilators 17 and 18 are energized, alternate bubbles which have been replicated at replicators R1 and R2 are propagated along coupling paths 15 and 16 toward the respective detectors are annihilated. Inasmuch as the distance between the replicators and the selective annihilators is different, different bubbles are annihilated in the coupling paths. If, in a typical embodiment, the difference in distance is one bit position, alternate bits will be annihilated in the coupling paths. In particular, all of the even numbered bits will propagate to one detector and all of the odd numbered bits will propagate to the other detector. The other, intermediate, bits are annihilated in each path. However, when the two detectors are placed in the same bridge circuit, as shown, the full data rate can be reclaimed.

Thus, there has been shown and described a magnetic bubble domain circuit design which permits a simple FIFO bubble memory shift register to provide continuous data storage. The circuit design shown and described enables all of the control functions to be aligned at the same bit position which clearly simplifies the shift control electronics. Moreover, the design uses only unipolar control pulses which also simplifies the matrixing electronics used in large, multiple chip systems. An additional advantage is obtained by locating the detectors outside of the storage loop whereby they can be arranged independently without affecting the storage loop and can be operated in alternating bit modes which offers better signal output and minimizes bubble to bubble interactions. Those skilled in the art will recognize that modifications to the system can be achieved. However, any such modifications which fall within the purview of the instant description are intended to be included therein. The description of the preferred embodiment above is intended to be illustrative only and is not intended to be limitative. The scope of the invention is limited only by the scope of the appended claims.

Having thus described a preferred embodiment of the invention, what is claimed is:

1. In combination
   means for propagating information bits in the form of magnetic bubble domains through an information channel,
   first and second switch means for transferring information bits out of said information channel,
   detector means,
   first and second coupling path means arranged respectively between said first and second switch means and said detector means, and
   first and second annihilator means arranged adjacent to said first and second coupling path means respectively for annihilating information bits in said coupling paths,
   each of said first and second annihilator means arranged at different distances from one of said first and second switch means.

2. The combination recited in claim 1 wherein said first and second switch means comprise passive replicator means.

3. The combination recited in claim 1 including source means for concurrently supplying signals to said first and second annihilator means whereby said first and second annihilator means concurrently annihilate information bits in each of said first and second coupling paths.

4. The combination recited in claim 1 wherein said first annihilator means is arranged at a distance from said first replicator means which distance is equal to one information bit different from the distance said second annihilator means and said first replicator means whereby alternate information bits are applied to said detector means.

5. The combination recited in claim 1 wherein said information channel comprises a single continuous propagation path.

6. The combination recited in claim 1 including generator means for supplying magnetic bubble domains to said information channel,
 third annihilator means for annihilating magnetic bubble domains in said information channel,
 said detector means, said generator means and said third annihilator means arranged equidistant from said first switch means.

7. The combination recited in claim 1 wherein said detector means includes first and second detector portions coupled to said first and second coupling path means respectively.

8. The combination recited in claim 7 wherein said first and second detector portions include first and second sensing elements respectively,
 said first and second sensing elements connected together to form a bridge network in order to sense information bits from said first and second coupling path means respectively.

9. The combination recited in claim 8 wherein said first and second sensing elements are located at the same distance from said first and second switch means respectively.

10. The combination recited in claim 1 wherein said first and second annihilator means comprise first and second conductor loops which encompass at least portions of said first and second coupling path means.

11. The combination recited in claim 8 wherein said first and second sensing elements each comprise magnetoresistance devices.

12. The combination recited in claim 5 wherein said single continuous propagation path comprises a plurality of propagation pattern devices.

13. The combination recited in claim 2 wherein said first and second replicator means are of the nondestructive readout configuration.

* * * * *

UNITED STATES PATENT AND TRADEMARK OFFICE
CERTIFICATE OF CORRECTION

PATENT NO. : 4,024,517
DATED : May 17, 1977
INVENTOR(S) : Thomas T. Chen

It is certified that error appears in the above-identified patent and that said Letters Patent are hereby corrected as shown below:

Column 4, line 11, change "are" to --and--.
Column 5, line 14, after "distance" insert --between--.
Column 6, line 27, after "second" insert --passive--.

Signed and Sealed this

Fifteenth Day of November 1977

[SEAL]

Attest:

RUTH C. MASON
*Attesting Officer*

LUTRELLE F. PARKER
*Acting Commissioner of Patents and Trademarks*